United States Patent [19]
Oh

[11] Patent Number: 6,038,178
[45] Date of Patent: Mar. 14, 2000

[54] HIGH-VOLTAGE GENERATOR FOR WORD LINES OF A BANK-ACTIVATED SEMICONDUCTOR MEMORY DEVICE

[75] Inventor: Young Nam Oh, Kyoungki-do, Rep. of Korea

[73] Assignee: Hyundai Electronics Industries Co., Ltd., Ichon-shi, Rep. of Korea

[21] Appl. No.: 09/219,852

[22] Filed: Dec. 23, 1998

[30] Foreign Application Priority Data

Dec. 24, 1997 [KR] Rep. of Korea ........................ 97-73407

[51] Int. Cl.[7] ...................................................... G11C 7/00
[52] U.S. Cl. .............................. 365/189.09; 365/189.11; 365/230.03; 365/226; 327/536; 327/537
[58] Field of Search ............................... 365/189.09, 226, 365/230.03, 189.11; 327/536, 537

[56] References Cited

U.S. PATENT DOCUMENTS

5,404,330 4/1995 Lee et al. ............................ 365/189.11

*Primary Examiner*—Andrew Q. Tran
*Attorney, Agent, or Firm*—Jacobson, Price, Holman & Stern, PLLC

[57] ABSTRACT

A semiconductor memory device operates at a high speed by applying high-voltage used for driving word lines in accordance with an activated state of a bank by using a high-voltage circuit controlled for each bank or by inserting control circuits in each output stage of the high-voltage circuit in the memory device adopting a number of banks. The memory device includes a high-voltage generation circuit that includes a number of unit high-voltage generation circuits that output a high-voltage of the same level, and a multi-bank circuit that includes a number of unit bank circuits driven independently in response to the high-voltage signal of a corresponding unit high-voltage generation circuit, a corresponding row decoder output signal and a corresponding column decoder output signal.

8 Claims, 8 Drawing Sheets

HIGH-VOLTAGE GENERATOR FOR WORD LINES OF A BANK-ACTIVATED SEMICONDUCTOR MEMORY DEVICE

BACKGROUND OF THE INVENTION

1. Field of the Invention

This invention relates to a semiconductor memory device. More particularly, this invention relates to a high-voltage generator for word lines of a bank-activated semiconductor memory device which operates large quantities of data at high speeds by applying high voltage used for driving word lines in accordance with the activated state of the bank by using a high voltage circuit controlled for each bank or by inserting control circuits between each output stage of the high voltage circuits in the memory device which adopts a number of banks such as a synchronous DRAM.

2. Description of the Prior Art

In general, the high voltage circuit is used in the word line or data output buffer which requires step-up voltage, and has a format in which one high voltage circuit controls the bank and also drives the data output buffer.

Therefore, there is a problem in the AC property of on-chip high voltage circuit which occurs due to the number of activated memory arrays which are, simultaneously, operating in high frequencies or the activated time between selected banks is short. That is, under-shoot or over-shoot occurs on the high voltage node when the arrays are activated and malfunction occurs when the arrays are sensed.

SUMMARY OF THE INVENTION

Therefore, it is an object of the invention to provide a semiconductor memory device having high memory operation by using independent a high voltage circuit controlled for each bank or by inserting the control circuit which is operating in accordance with the activated state of the bank between each independent high voltage output to prevent over-shoot or under-shoot from occurring in the high voltage signal of the unit bank which is driven by the high voltage signal using a selective high voltage output in accordance with activation of the bank.

According to the present invention, the semiconductor memory device, comprising a high voltage generation means which includes a number of unit high voltage generation portions ("portions" may be circuits) outputting a high voltage of same level and a multibank portion which includes a number of unit bank circuits which are driven independently by one another in response to the high voltage signal of the unit high voltage generation portion, row decoder output signal and column decoder output signal, is provided.

DESCRIPTION OF THE PREFERRED EMBODIMENT

Figure 1:
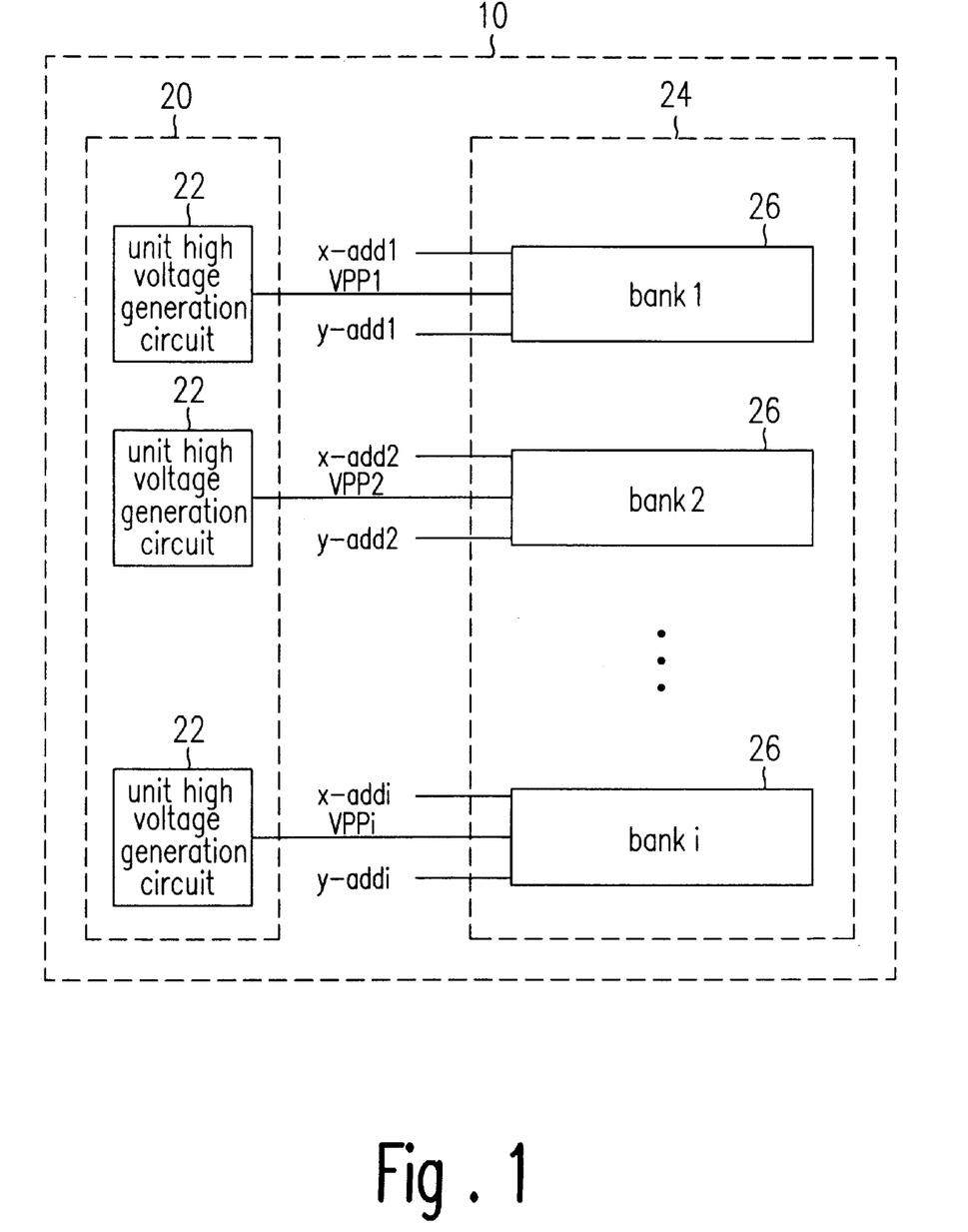
FIG. 1 is a specific block diagram showing the first embodiment of high voltage circuit for multibank.

FIG. 1 is a specific block diagram showing the first embodiment of a high voltage circuit for multibank, wherein the multibank high voltage circuit 10 includes an on-chip high voltage generation portion 20 consisting of a number of unit high voltage generation portion 22 and a multibank portion 24 consisting of unit bank portions 26 which are driven by each output (VPP1 to VPPi) of the unit high voltage generation portion 22, row decoder output signal (x-addl to x-addi) and column decoder output signal (y-addl to y-addi).

In operation, the on-chip high voltage generation portion 20 including a number of high voltage generation portion 22 applies a high voltage (1.5 Vdd) to each corresponding unit bank portion 26 when it is activated, wherein row address for the unit bank portion 26 is determined if an instruction (generally, instruction acting such as uniqu /RAS of DRAM) driving unit bank portion 26 is inputted, and row decoder output signal (x-add) is transferred to it sequentially, and the high voltage activated already and the row decoder output signal selects the word line group in the unit bank portion 26. Then, if the following instruction (generally, an instruction such as unique /CAS of DRAM) is inputted, column address for unit bank portion 26 is determined and column decoder output signal (y-add) is transferred, wherein the bit line group is assigned.

Figure 2:
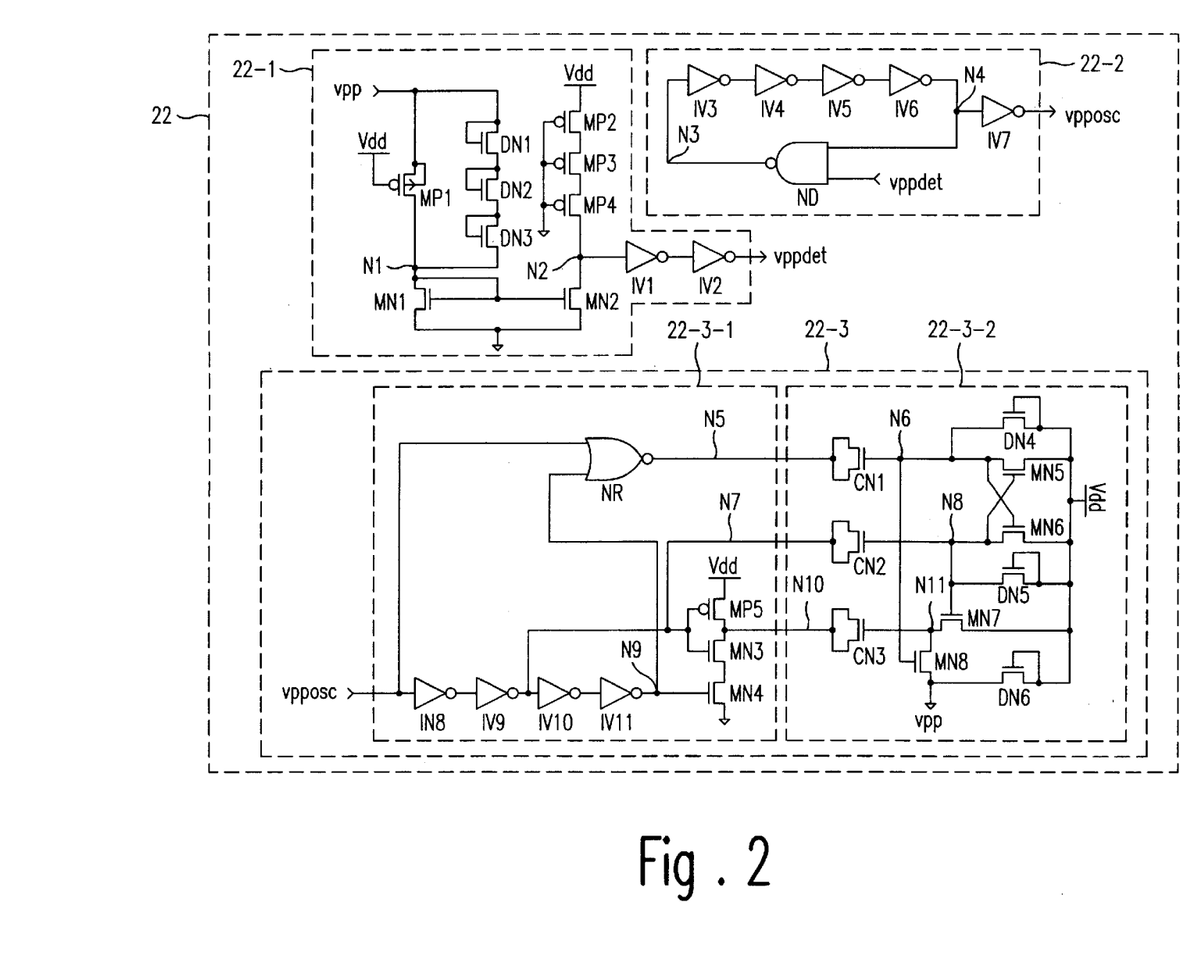
FIG. 2 is a specific circuit diagram for the unit high voltage generation portion of FIG. 1.

FIG. 2 is a specific circuit diagram for the unit high voltage generation portion of FIG. 1. The unit high voltage generation portion 22 includes a high voltage level sensing portion 22-1 which outputs high voltage level sensing signal vppdet after sensing the high voltage vpp and power voltage vdd, a ring oscillator portion 22-2 which generates ring oscillator output signal vpposc using the high voltage level sensing signal vppdet as input, and a charge pump portion 22-3 which is driven by the ring oscillator output signal vpposc and generates desired high voltage level.

The charge pump portion 22-3 includes pump control portion 22-3-1 and pump portion 22-3-2.

The high voltage level sensing portion 22-1 includes: a first PMOS type transistor MP1 whose gates are connected to power voltage vdd and connected between high voltage input terminal vpp and the first node N1; the first, the second and the third MOS diodes DN1, DN2 and DN3 connected between the high voltage input terminal vpp and the first node N1; the second, the third and the fourth PMOS type transistors MP2, MP3 and MP4 whose gates are connected to ground voltage terminal respectively and are connected between the power voltage vdd terminal and the second node N2 serially; a current mirror which consists of the first nMOS type transistor MN1 and the second nMOS type transistor MN2 whose gates are connected commonly to the first node N1 and are between the first node N1 and the second node N2, and the ground voltage terminal; and the first and second inventors IV1, IV2 connected between the second node N2 and the output stage of the high voltage level sensing signal vppdet serially.

The ring oscillator portion 22-2 includes NAND gate ND whose one input stage is connected to the fourth node N4, whose other input stage is connected to the high voltage level sensing signal vppdet and whose output stage is connected to the third node N3; the third, the fourth, the fifth and the sixth inverters IV3, IV4, IV5 and IV6 which are connected between the third node N3 and the fourth node N4 serially; and the seventh invertor IV7 which is connected between the fourth node N4 and ring oscillator output stage.

The pump control portion 22-3-1 includes the eighth and the ninth inverters IV8, IV9 which are connected serially between output stage of the ring oscillator output signal vpposc and the seventh node N7; the tenth and eleventh inverters IV10, IV11 which are connected between the seventh node N7 and the ninth node N9 serially; a NOR gate NR wherein one input stage is an output signal of oscillator, whose other input stage is connected to the ninth node N9, and whose output stage is connected to the fifth node N5, the fifth pMOS type transistor MP5 and the third nMOS type transistor MN3 whose gates are connected commonly to the seventh node N7 and connected between the power voltage terminal and drain terminal of the fourth nMOS type transistor MN4, and whose output stage is connected to the tenth node; and the fourth nMOS type transistor MN4 whose gate is connected to the ninth node N9 and connected between the source terminal of the third nMOS type transistor MN3 and the ground voltage stage terminal.

The pump portion 22-3-2 includes of the first nMOS type capacitor CN1 connected between the fifth node N5 and the sixth node N6; the second nMOS type capacitor CN2 connected between the seventh node N7 and the eighth node N8, the third nMOS type capacitor CN3 connected between the tenth node N10 and the eleventh node N11; the fourth nMOS type diode DN4 connected between the power voltage terminal vdd and the sixth node N6; the fifth nMOS type transistor MN5 whose gate is connected to the eighth node N8 and is connected between the power voltage terminal vdd and the sixth node N6; the sixth nMOS type transistor MN6 whose gate is connected to the sixth node N6 and is connected between the power voltage terminal and the eighth node N8; the fifth nMOS type diode DN5 connected between the power voltage terminal and the eighth node N8; the seventh nMOS type transistor MN7 whose gate is connected to the eighth node N8 and is connected between the power voltage terminal and the eleventh node N11; the eighth nMOS type transistor MN8 whose gate is connected to the sixth node N6 and is connected between the eleventh node N11 and the ground voltage terminal; and the sixth nMOS diode DN6 connected between the power voltage terminal and the ground voltage terminal.

If the power voltage turns on, the high voltage level sensing portion remains in the state which enables the charge pump portion, that is, the high voltage level sensing signal vppdet, remains in the state of logic high, wherein the ring oscillator output signal vpposc is generated only when the high voltage level sensing signal is in the state of logic high and the voltage level Vdd-Vt precharged in the high voltage vpp node when the power voltage turns on is increased to the high voltage 1.5 Vdd by the operation of the charge pump portion which is driven by the oscillator output signal. Thereafter the voltage level remains in high voltage level under the control of the high voltage level sensing portion.

Figure 3:
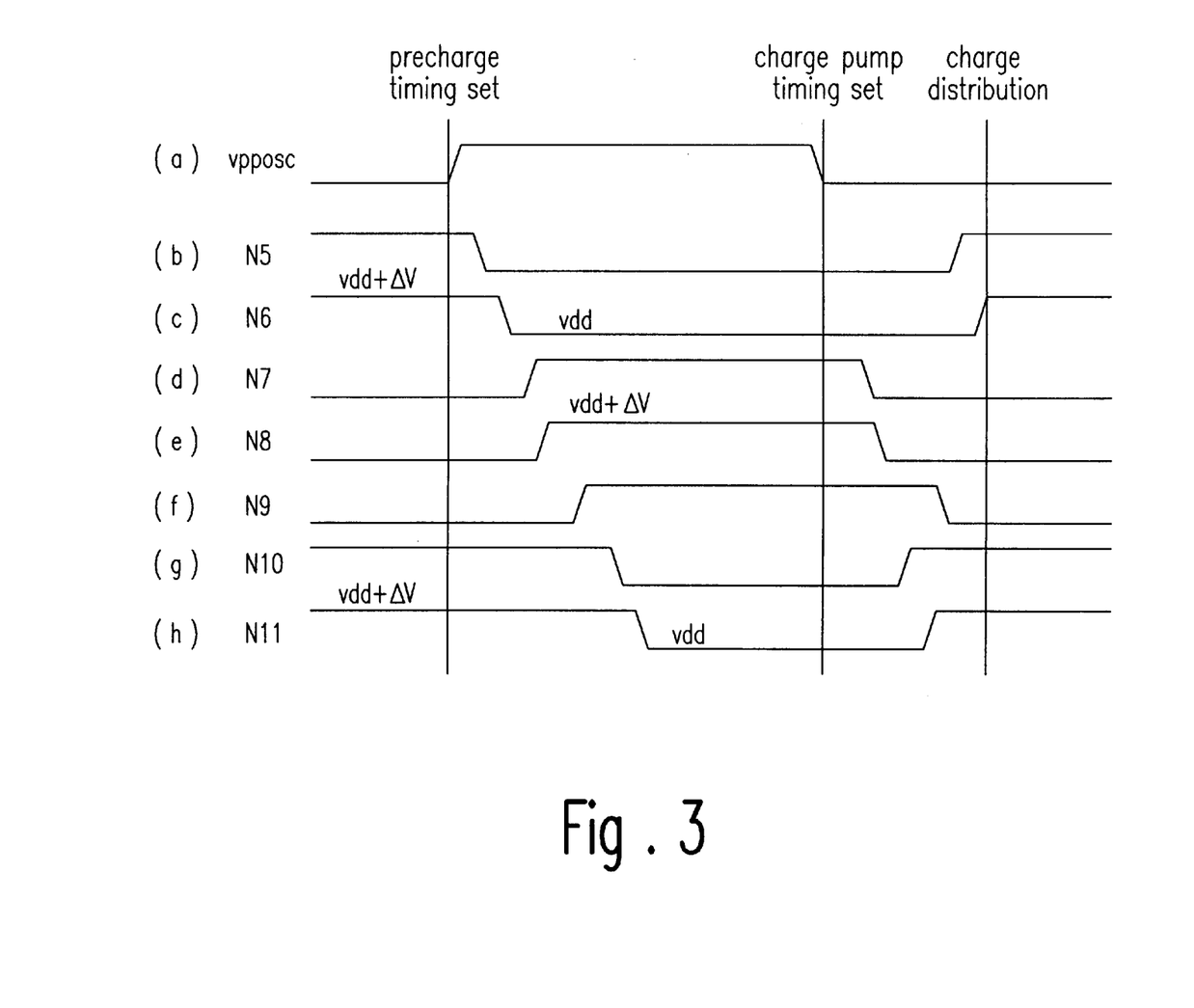
FIG. 3 is an operation timing diagram of the unit high voltage generation portion of FIG. 2.

The general operation of the charge pump can be explained in more detail with reference to the timing diagram of FIG. 3.

If the ring oscillator output signal such as precharge timing set of (a) is transferred from "logic low" to "logic high" in order to precharge the charge pump portion, the output of NOR gate is transferred from "logic high" to "logic low" as shown in (b), wherein the sixth node N6 which is the output node of the first nMOS diode is transferred to the "logic high" from the high voltage Vdd+ΔV as shown in (c) and turns off the eighth nMOS type transistor MN8. Furthermore, the seventh node is transferred from "logic low" to "logic high" after delay time of the eighth and ninth inverters as shown in (d), wherein it transfers the eighth node which is an output node of the second nMOS capacitor from "logic high" to high voltage Vdd+ΔV as shown in (e) and turns on the seventh nMOS type transistor. The ninth node is transferred from "logic low" to "logic high" after delay time of the tenth and eleventh inverter as shown in (f), wherein it turns on the fourth nMOS type transistor and transfers the tenth node from "logic high" to "logic low" as shown in (g), and the eleventh node, which is the output node of the third nMOS capacitor, is transferred from high voltage Vdd+ΔV to "logic high" as shown in (h) and the precharge operation of charge pump is completed.

For the charge pumping operation of the charge pump portion 22-3, if the ring oscillator output signal vpposc is transferred from "logic high" to "logic low" such as in the charge pump timing set of (a), the seventh node N7 is transferred from "logic high" to "logic low" after delay time of the eighth and ninth inverters IV8 and IV9 as shown in (d) and transfers the eighth node N8 which is the output node of the second nMOS capacitor CN2 from high voltage Vdd+ΔV to "logic high" as shown in (e). Then it turns off the seventh nMOS type transistor MN7, also transfers the tenth node N10 from "logic low" to "logic high" as shown in (g) by turning on the fifth PMOS type transistor MP5 and increases the eleventh node N11 which is output node of the third nMOS capacitor CN3 from "logic high" to high voltage Vdd+ΔV as shown in (h). And then, the ninth node N9 is transferred from "logic high" to "logic low" after delay time of the tenth and eleventh inverters IV10 and IV11 as shown in (f) so that the fifth node N5 which is output of NOR gate NR is transferred from "logic low" to "logic high" as shown in (b) and the sixth node N6 which is output of the first nMOS capacitor CN1 is transferred from "logic high" to high voltage Vdd+ΔV as shown in (c). Thereafter, it turns on the eighth nMOS transistor MN8, wherein charge sharing occurs between the eleventh node N11 having increased voltage already and high voltage, and thereafter the high voltage, the final output completes the voltage step-up.

If the high electric potential is transferred to the high voltage by repeating the operation after time passes, the pumping operation of charge pump does not occur since the output signal of ring oscillator does not generate periodic pulse signals, and the high electric potential is lowered if missing charge occurs in the high voltage node after time passes and the ring oscillator output signal generates periodic pulse signals and the above listed operations are repeated.

Figure 4:
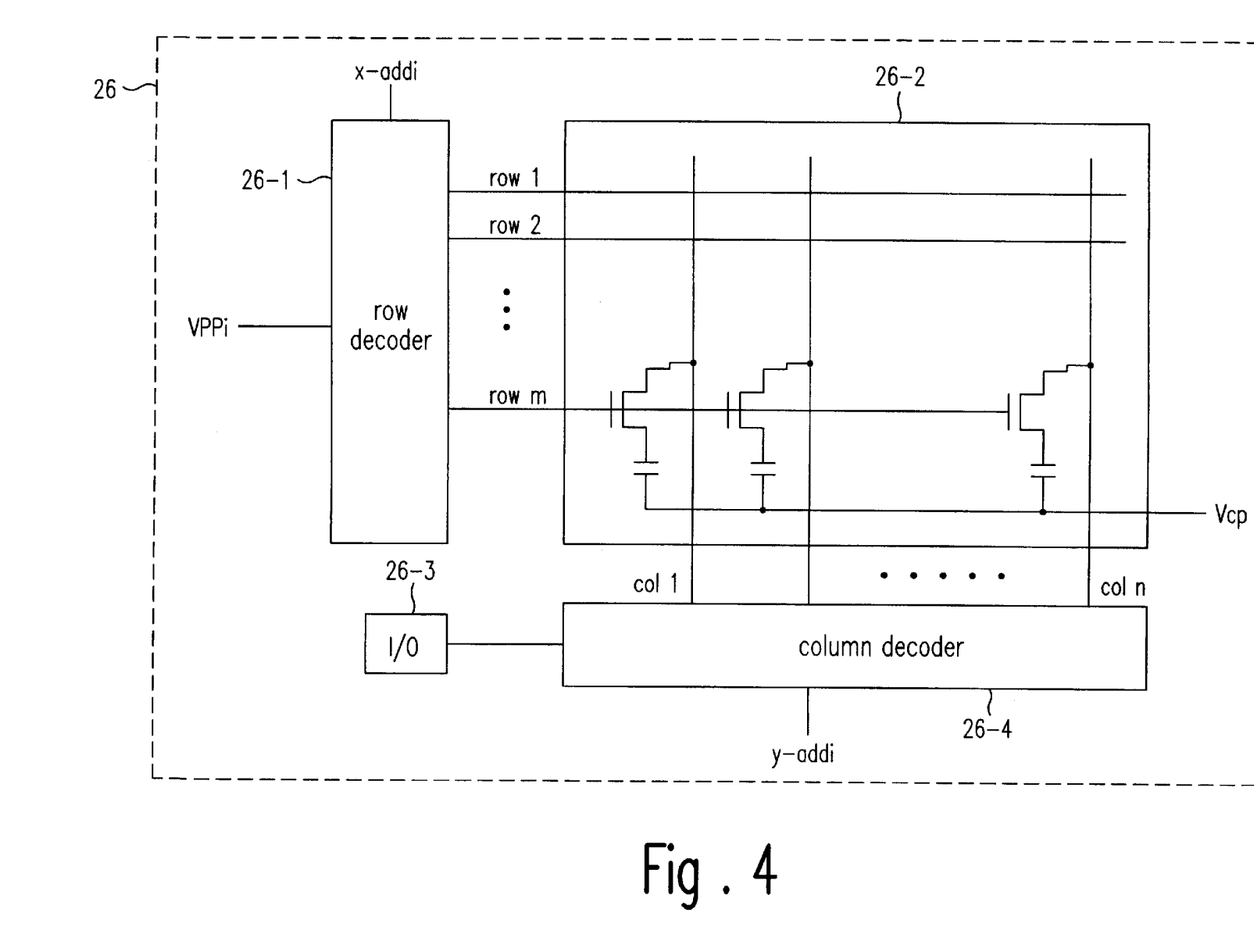
FIG. 4 is a specific block diagram of the unit bank portion of FIG. 1.

FIG. 4 is a specific block diagram of the unit bank portion of FIG. 1, and explains the application examples of output signals of high voltage circuit of the invention.

In the row decoder 26-1, x-addi and VPPi which is unit outputs of high speed step-up electric potential are used for enabling the word line respectively. Specifically, one word line is selected among m word line groups using row address. The word lines are connected to a number of memory cells. There are a number of bit lines in the selected word line and one of the bit lines is connected to the column of the memory cell, wherein, the column decoder 26-4 connects one of the n bit lines to the data input/output portion 26-3 using the column address.

The structures of row decoder, column decoder, and data input/output portion are well known so the explanation of them are omitted.

Figure 5:
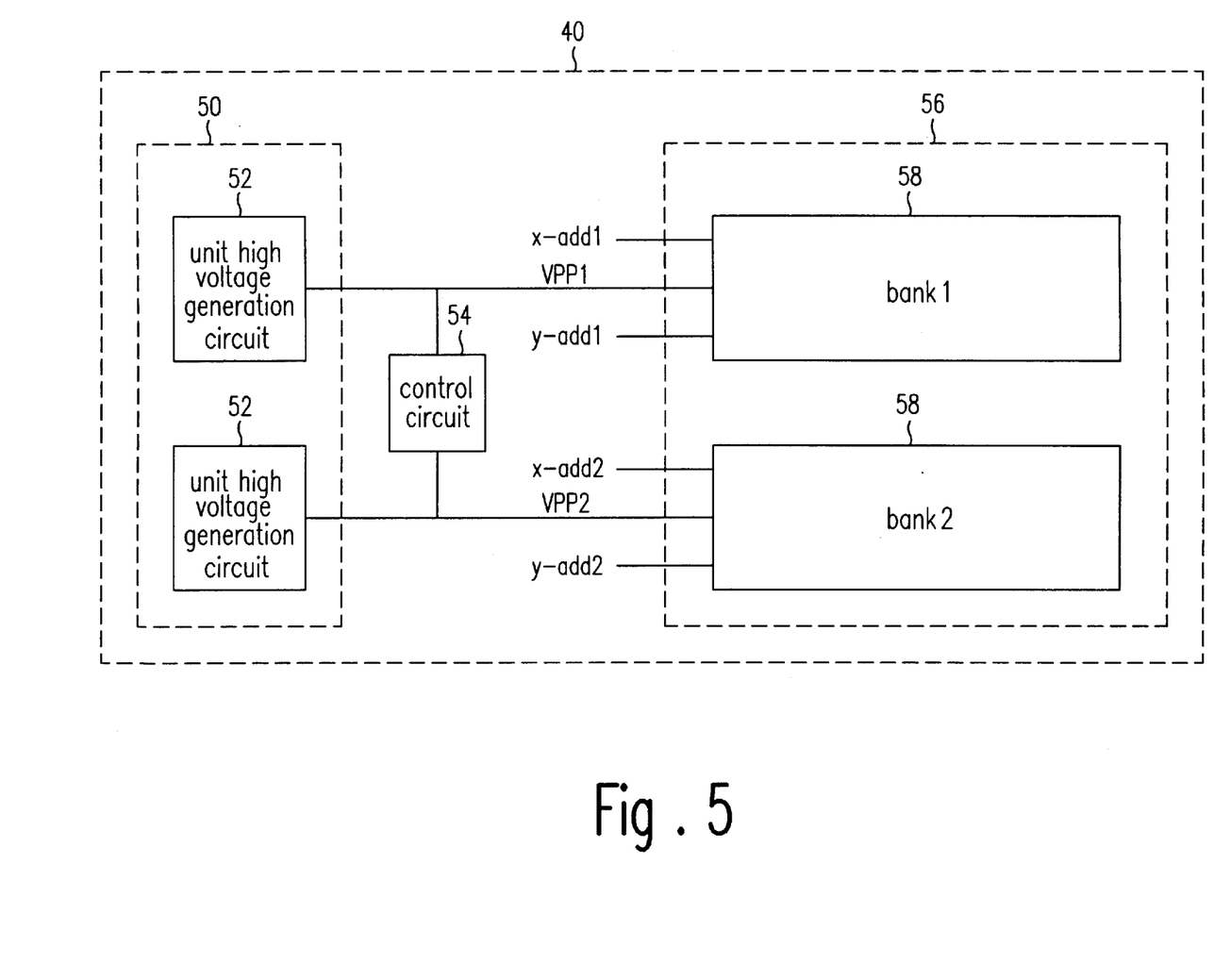
FIG. 5 is a specific block diagram showing the second embodiment of high voltage circuit for multibank.

FIG. 5 is a specific block diagram showing the second embodiment of high voltage circuit for multibank. The multibank high voltage generation circuit 40 includes an on-chip high voltage generation portion 50 which consists of two unit high voltage generation portions 52; multibank portion 56 which consists of unit bank portions 58 driven by the output VPP1 or VPP2 of unit high voltage generation portions 52, row decoder output signal x-add1 or x-add2 and column decoder output signal y-add1 or y-add2; and control portion 54 connected between unit high voltage generation portion 52 outputting VPP1 and unit high voltage generation portion 52 outputting VPP2.

The structure is an example of two unit high voltage generation portions and two unit bank portions. It can also be applied to a number of unit high voltage generation portion and a number of unit bank portion, wherein the control portion is connected between the two output stages of unit high voltage generation portions, and the method of connection can be made in various combinations.

The difference from the first embodiment is that the control portion is added between the two outputs of the unit high voltage generation portion.

Figure 6:
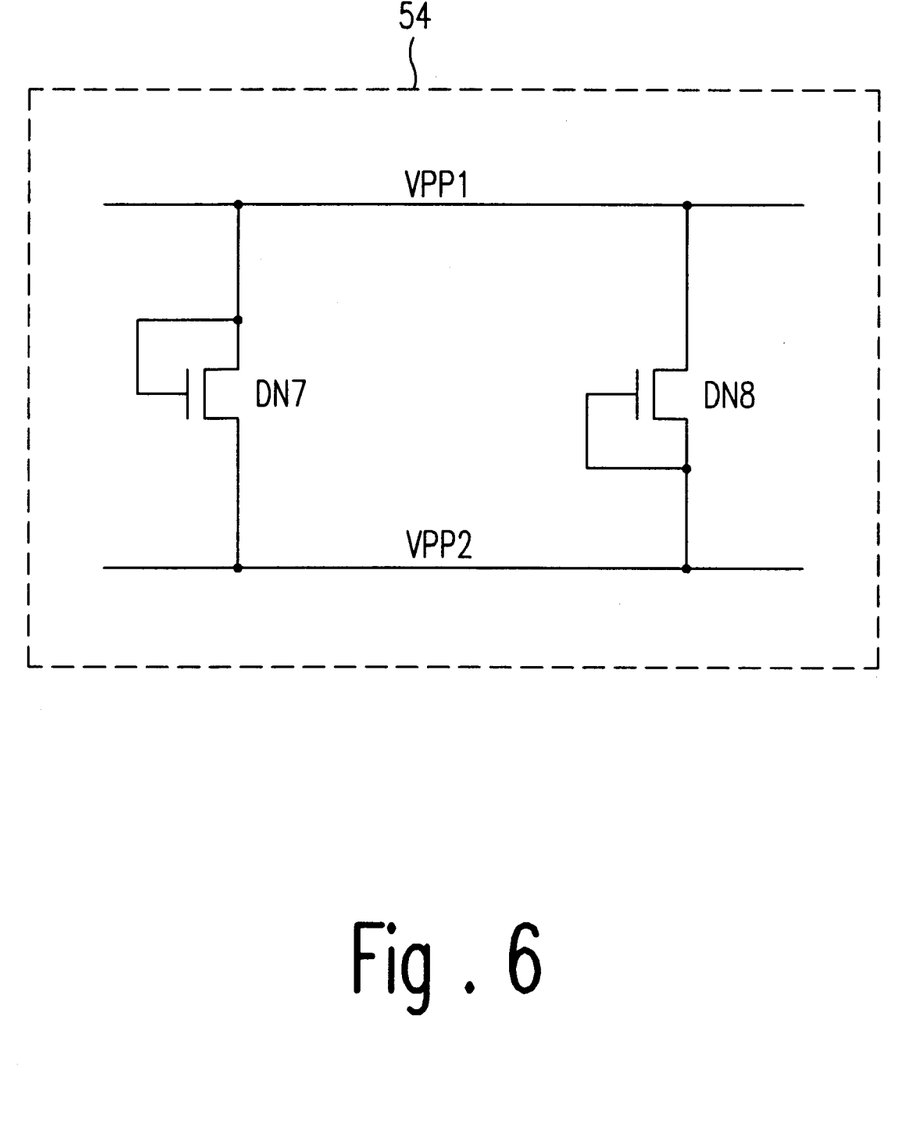
FIG. 6 is a specific circuit diagram for the control portion of FIG. 5.

Accordingly, only the operation of the control portion is explained below, with reference to FIG. 6.

The output of the first unit high voltage generation portion is VPP1, and the output of the second unit high voltage generation portion is VPP2.

There is the seventh nMOS diode which is forward biased from VPP1 to VPP2 and the eighth nMOS diode which is forward biased from VPP2 to VPP1.

If the first bank is activated first, under-shoot occurs in the VPP1 node and there is an electric potential difference of both nodes of more than Vt, then the eighth nMOS diode turns on and compensates for the under-shoot in the VPP1 node. Reversely, if the second bank is activated at first, under-shoot occurs in the VPP2 node and there is an electric potential difference of both nodes of more than Vt, then the seventh nMOS diode turns on and compensates for the under-shoot in the VPP2 node.

Also, if over-shoot occurs in the VPP1 node of the first bank in the course of activation and there is an electric potential difference of both nodes of more than Vt, then the seventh nMOS diode turns on and discharges the over-voltage to the VPP2. Reversely, if over-shoot occurs in the VPP2 and there is an electric potential difference of both nodes more than Vt, then the eighth nMOS diode turns on and discharges the over-voltage to the VPP1.

Figure 7:
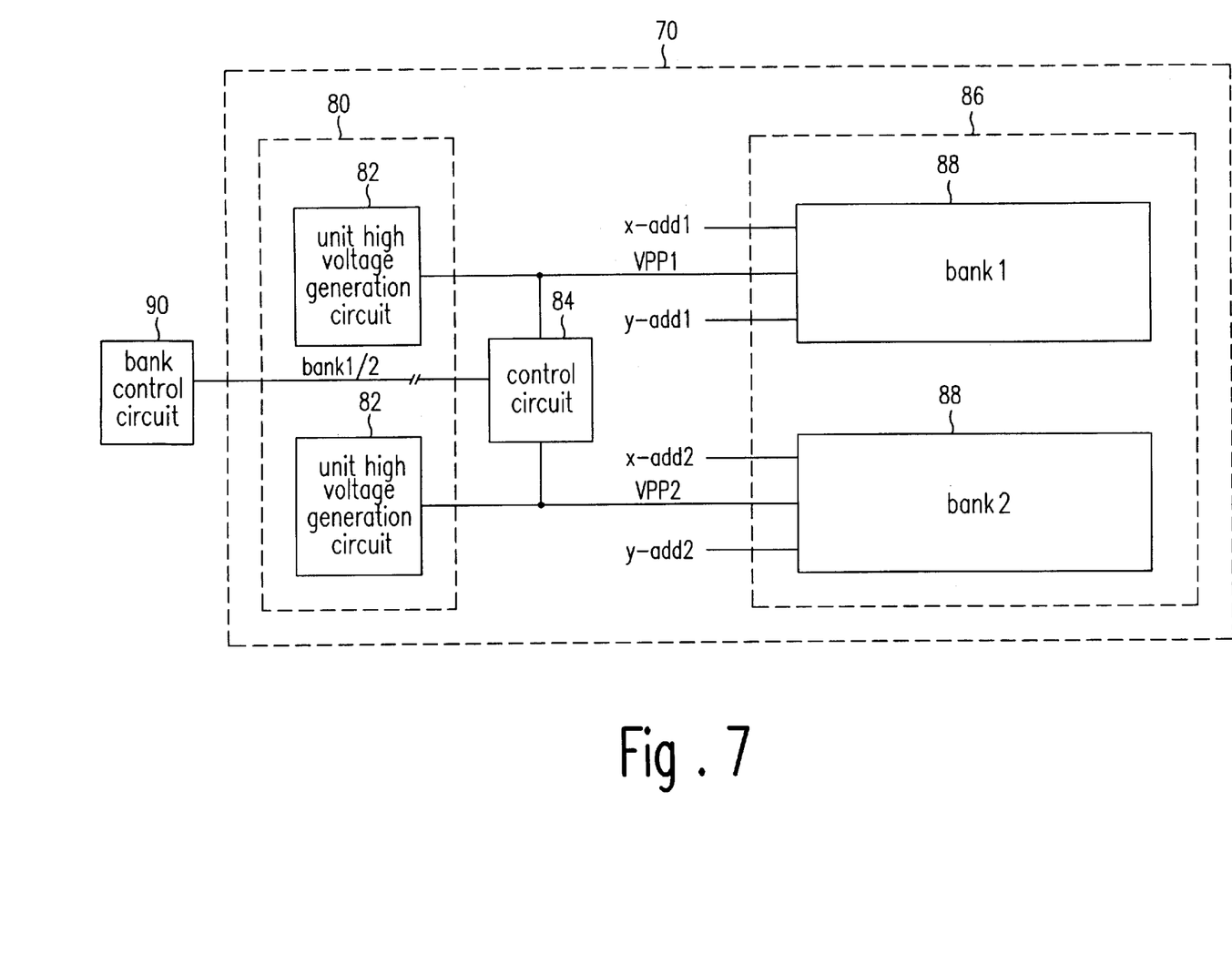
FIG. 7 is a specific block diagram showing the third embodiment of a high voltage circuit for multibank.

FIG. 7 is a specific block diagram showing the third embodiment of high voltage circuit for multibank.

The multibank high voltage generation portion circuit 70 includes an on-chip high voltage generation portion 80 which consists of two unit high voltage generation portions 82, a multibank portion 86 which consists of unit bank portions 88 driven by the output VPP1 or VPP2 of unit high voltage generation portions 82 and column decoder output signal y-add1 or y-add2, a control portion 84 which is connected between unit high voltage generation portion 82 outputting VPP1 and unit high voltage generation portion 82 outputting VPP2 and is controlled by the two bank select signals bank1 and bank2, and bank control portion 90 which is operated by the output of command decoder and outputs bank selection signal.

The structure is an example of two unit high voltage generation portion and two unit bank portions. It can also be applied to a number of unit high voltage generation portions and a number of unit bank portions. The control portion is connected between the two output stages of unit high voltage generation portion, and the method of connection can be made in various combinations.

Here, the bank control portion has the same number as the control portions.

Figure 8:
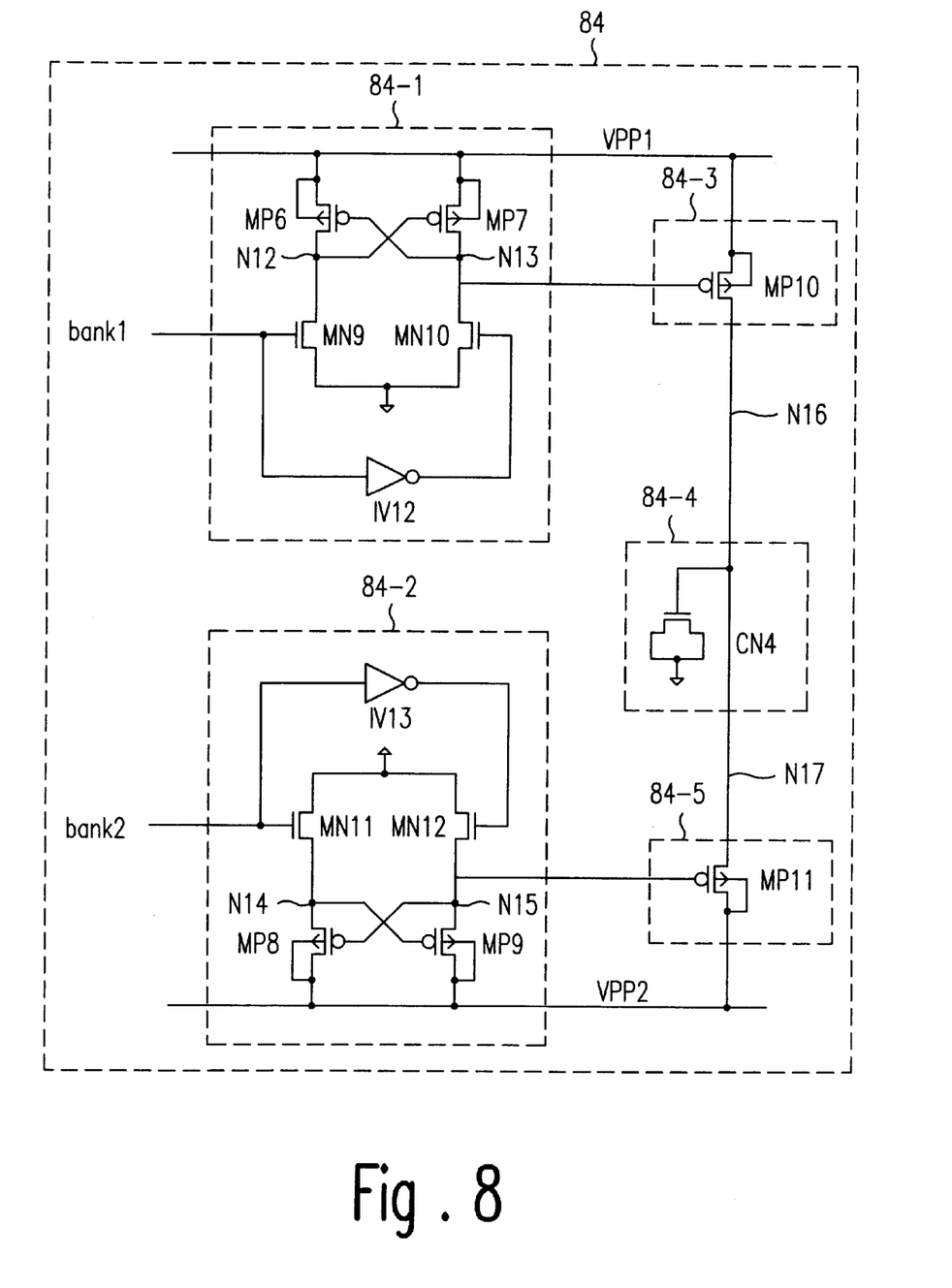
FIG. 8 is a specific circuit diagram for the control portion of FIG. 7.

FIG. 8 is a specific circuit diagram for the control portion of FIG. 7.

The control portion includes the first level shifter portion 84-1 which is connected to the VPP1 node and is controlled by bank1, and outputs signal controlling the operation of the first switch portion 84-3; the second level shifter portion 84-2 which is connected to VPP2 node and controlled by bank2, and outputs signal controlling the operation of the second switch portion 84-5; the first switch portion 84-3 which is connected between VPP1 node and the sixteenth node N16 and controlled by the output signal of the first level shifter portion 84-1; the second switch portion 84-5 which is connected between VPP2 node and the seventeenth node N17 and controlled by the output signal of the second level shifter portion 84-2; and charge storage portion 844 connected between the sixteenth node N16 and the seventeenth node N17.

The first level shifter portion 84-1 consists of the seventh PMOS type transistor MP7 whose gate is connected to the twelfth node N12 and is connected between VPP1 node and the thirteenth node N13; the sixth pMOS type transistor MP6 whose gate is connected to the thirteenth node N13 and is connected between VPP1 node and the twelfth node N12; the ninth nMOS type transistor MN9 whose gate receives bank1 signal and is connected between the twelfth node N12 and the ground voltage terminal; the twelfth inverter IV12 which outputs an inverted signal of bank1; and the tenth nMOS type transistor MN10 whose gate is connected to output stage of the twelfth inverter IV12 and is connected between the thirteenth node N13 and the ground voltage terminal.

The second level shifter portion 84-2 consists of the ninth pMOS type transistor MP9 whose gate is connected to the fourteenth node N14 and is connected between VPP2 node and the fifteenth node N15, the eighth pMOS type transistor MP8 whose gate is connected to the fifteenth node N15 and is connected between VPP2 node and the fourteenth node N14, the eleventh nMOS type transistor MN11 whose gate receives the bank2 signal and is connected between the fourteenth node N14 and the ground voltage terminal, the thirteenth inverter IV13 outputting the inverted bank1, and the twelfth nMOS type transistor MN12 whose gate is connected to the output stage of the thirteenth inverter IV13 and is connected between the fifteenth node N15 and the ground voltage terminal.

The first switch portion consists of the tenth PMOS type transistor MP10.

The second switch portion consists of the eleventh pMOS transistor MP11.

The charge storage portion consists of the fourth nMOS capacitor CN4 connected between the sixteenth node and the ground voltage terminal.

The bank control portion receives four states through the command decoder in the case of two bank format in the synchronous DRAM, that is, the free charge state (the first state) in which bank1 and bank2 are low logic, row active bank1 state (the second state) in which the bank1 is logic high and bank2 is logic low, row active bank2 state (the third state) in which bank1 is logic low and bank2 is in the logic high, and both bank active state (the fourth state) in which bank1 and bank2 become active with time difference.

The first level shifter portion controls the first switch portion by decoding one of the four states.

The second level shifter portion controls the second switch portion by decoding one of the four states.

In case that the level shifter portion is in the first state (precharge state), the ninth nMOS transistor and the seventh pMOS transistor turn off and the tenth nMOS type transistor and the sixth pMOS type transistor turn on since the bank1 is in the logic low, after then, the thirteenth node becomes logic low and the twelfth node becomes VPP1 electric potential and the fourteenth node becomes VPP2 electric potential and the fifteenth node becomes logic low since the bank2 is logic low.

In the case of the second state, the thirteenth node which is the final output node is VPP1 electric potential since the bank1 is logic high, and the fifteenth node which is the final output is logic low since the bank2 is in the logic low.

In the case of the third state, the thirteenth node which is the final output node is in the logic low since the bank1 is logic low, and the fifteenth node which is the final output is in the VPP2 electric potential since the bank2 is in the logic high.

In the case of the fourth state, the thirteenth node and fourteenth node which are the final output node are in the VPP1 and VPP2 electric potential since both bank1 and bank2 are logic high.

The first switch portion, the second switch portion and charge storage portion stabilize or isolate the under-shoot or over-shoot in the VPP1 or VPP2 occurred in the activation.

For example, in the case of the first state, the first switch portion and the second switch portion turn on and the VPP1 and VPP2 are connected all together so the electric potential equilibrium is made so that VPP1 and VPP2 electric potential are stabilized since the fourth nMOS capacitor of charge storage portion is charged.

In the case of the second and the third state in which the corresponding bank is activated, the high voltage electric potential is isolated by turning off the switch in order not to effect remaining high voltage electric potential of another bank.

In the case of the fourth state, the noise interference phenomenon occurring in the activation of all banks can be removed by using the switch operation to turn it off instantaneously, and the equilibrium state can be recovered in rapidly since the switching device turns on by the following first state.

Consequently, the under-shoot and over-shoot of each independent high voltage electric potential signal can be reduced by turning on or turning off selectively, the first switch portion and the second switch portion which are inserted between VPP1 and VPP2 selectively in accordance with precharge of bank or command word of activation state.

When the multibank high voltage generation circuit of the invention is used, the under-shoot or over-shoot occurring in the high voltage signal driving the word line of unit bank circuit which is driven by the high voltage signal can be reduced by using selective high voltage output in accordance with activation of the bank, and high speed operation memory can be embodied consequently.

Having described preferred embodiment of the invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed:

1. A high-voltage generator for word lines of a bank-activated semiconductor memory device, the generator comprising:

a high-voltage generation circuit that includes a number of unit high-voltage generation means that each output a high-voltage signal of a same level; and a multi-bank circuit that includes a number of unit bank circuits that are each driven independently in response to the high-voltage signal from corresponding unit high-voltage generation means, a corresponding row decoder output signal, and a corresponding column decoder output signal;

wherein each of the row decoder output signals and each of the column decoder output signals are different from each other.

2. The generator of claim 1, wherein at least one of the unit high-voltage generation means includes:

a high-voltage sensing means for outputting a high-voltage level sensing signal by comparing a step-up high-voltage and a power voltage;

a ring oscillator, driven by the high-voltage level sensing signal, for generating a ring oscillator output signal having periodic pulses; and a charge pump means, driven by the ring oscillator output signal, for outputting the high-voltage signal for activating the word line.

3. The generator of claim 1, further comprising:

control means, connected to output terminals of the unit high-voltage generation means, for compensating high-voltage signals that have overshoot or undershoot with respect to the other high-voltage signals.

4. The generator of claim 3, wherein the control means includes:

an MOS diode.

5. The generator of claim 3, further comprising:

bank control means, driven by a decoding signal transmitted from a command decoder, for outputting at least a first bank selection signal and a second bank selection signal to the control means.

6. The generator of claim 5, wherein the control means includes:

a first level shifter that is driven by the first bank selection signal;

a first switching means, driven by the first level shifter, and having a first terminal connected to a first high-voltage output stage;

a second level shifter that is driven by the second bank selection signal;

second switching means, driven by the second level shifter, and having a first terminal connected to a second high-voltage output stage; and charge storage means, connected between a second terminal of the first switching means and a second terminal of the second switching means, for storing a charge during a precharge operation and for providing the charge for the high-voltage signal in which overshoot or undershoot occurs during bank activation.

7. The generator of claim 6, wherein the first switching means and the second switching means include:

an MOS transistor.

8. The generator of claim 6, wherein the charge storage means includes:

an MOS transistor.

* * * * *